(12) United States Patent
Park et al.

(10) Patent No.: US 7,679,948 B2
(45) Date of Patent: Mar. 16, 2010

(54) WRITE AND READ ASSIST CIRCUIT FOR SRAM WITH POWER RECYCLING

(75) Inventors: Heechoul Park, San Jose, CA (US); Song Kim, San Jose, CA (US); Lancelot Kwong, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 118 days.

(21) Appl. No.: 12/133,808

(22) Filed: Jun. 5, 2008

(65) Prior Publication Data
US 2009/0303819 A1    Dec. 10, 2009

(51) Int. Cl.
*G11C 11/00* (2006.01)
(52) U.S. Cl. .................. 365/154; 365/226; 365/203
(58) Field of Classification Search .......... 365/154, 365/156, 226, 203
See application file for complete search history.

(56) References Cited
U.S. PATENT DOCUMENTS

2007/0139997 A1 * 6/2007 Suzuki et al. ............... 365/154
2009/0161412 A1 * 6/2009 Suzuki et al. ............... 365/154

* cited by examiner

*Primary Examiner*—Huan Hoang
(74) *Attorney, Agent, or Firm*—Martine Penilla & Gencarella LLP.

(57) ABSTRACT

A memory circuit for reading and writing data into a SRAM memory array using charge recycling is presented. The write and read circuit includes a cell voltage level switch, a recycle charge storage, a precharge switch, a write enable switch, and column decoder. The cell voltage level switch is connected to a low power supply and a high power supply and has two states of operation: a write operation state and a read operation state. For each state of operation, the voltage level switch selectively provides a power supply if a column has been selected or if the operation is a read or write. The recycle charge storage stores excess charge from SRAM cells after a read operation or after a write operation in unselected columns. After the read or write operation, the recycle charge storage discharges excess charge to the bitlines during bitline precharging.

20 Claims, 5 Drawing Sheets

WRITE AND READ ASSIST CIRCUIT FOR SRAM WITH POWER RECYCLING

BACKGROUND OF THE INVENTION

1. Field of the Invention

The present invention relates generally to semiconductor memory devices and more particularly to an improved SRAM design for more stable SRAM performance and reduced power consumption.

2. Description of the Related Art

Historically, as circuit feature sizes are reduced and supply voltages are lowered, it has become increasingly difficult to achieve stable SRAM performance and design an SRAM cell that has both adequate static noise margin (SNM) and adequate trip voltage (Vtrip). The trip voltage (Vtrip) is a measure of the ability of a cell to write digital data into a SRAM cell.

The SNM quantifies the amount of voltage noise required at the internal nodes of the SRAM cell to flip the state of the digital data stored in the SRAM cell. The SNM may be determined graphically by plotting the voltage transfer curve of one of the inverters that comprises the latch of the SRAM cell and inverting the transfer curve of the other inverter. The voltage difference between the two voltage transfer curves is the SNM.

For SRAM cells in general, SNM and Vtrip are interdependent and design techniques that improve SNM, tend to degrade Vtrip and vice-versa. For example, if the passgate transistor is too strong relative to the drive transistor, SNM is degraded. If the pass gate is too weak relative to the drive transistor, Vtrip is degraded. Also, if the load is too weak relative to the drive transistor, SNM is degraded.

The SNM can be improved by decreasing the width of the pass gate transistor of the SRAM cell. This increases the resistance of the passgate transistor and increases the stability of the read signal from the SRAM cell. Conversely, the Vtrip can be improved by increasing the strength of the inverters in the SRAM cell. Due to the interdependent nature of the tradeoffs between write and read operations, it has become very difficult to achieve a SRAM design with high SNM and Vtrip. Thus, SRAM design has become a delicate balance of the relative strengths of the passgate, drive, and load transistors.

It is within this context that embodiments of the claimed invention arise.

SUMMARY OF THE INVENTION

Broadly speaking, the present invention is an apparatus and method for reading and writing data into a memory array and using charge recycling. It should be appreciated that the present invention can be implemented in numerous ways, including as a method, a system, or a device. Several inventive embodiments of the present invention are described below.

In accordance with a first aspect of the present invention, a memory circuit for reading and writing data into a SRAM memory array using charge recycling is presented. The write and read circuit includes a cell voltage level switch, a recycle charge storage, a precharge switch, a write enable switch, and column decoder. The cell voltage level switch is connected to a low power supply and a high power supply and has two states of operation: a write operation state and a read operation state. For each state of operation, the voltage level switch selectively provides either a low power supply or high power supply depending on whether or not a column has been selected or if the operation is a read or write. The recycle charge storage stores excess charge from SRAM cells after a read operation or after a write operation in unselected columns. After the read or write operation, the recycle charge storage discharges excess charge to the bitlines during bitline precharging.

In accordance with a second aspect of the present invention, a method of setting power supply configuration during writing or reading digital data to SRAM memory cells using charge recycling is provided. In this method, column(s) in which a read or write operation state are selected using output from the column decoder. Either a low power supply or high power supply is provided to SRAM cells, depending on whether or not a column has been selected and if the operation is a read or write. Excess charge is stored in a recycled charge storage and provided to the bitlines to complete precharging of the bitlines.

In accordance with a third aspect of the present invention, a method of writing or reading digital data to SRAM memory cells using charge recycling is presented. In this method, column(s) in which a read or write operation state are selected using output from the column decoder. Either a low power supply or high power supply is provided to SRAM cells, depending on whether or not a column has been selected or if the operation is a read or write. Excess charge is stored in a recycled charge storage and provided to the bitlines to complete precharging of the bitlines. Digital data is written into the SRAM cells selected for the write operation and digital data is read from SRAM cells in columns selected the read operation.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which:

FIG. 1B-2 illustrates the write operation state bias condition of SRAM cells in a row selected by an active wordline in accordance with one embodiment of the present invention.

FIG. 2 illustrates embodiments of the logic circuitry for the cell voltage level switch, the precharge switch, and the column selection switch in accordance with one embodiment of the present invention.

DETAILED DESCRIPTION

The following embodiments describe an apparatus and method for reading and writing data into a memory array and using charge recycling. It will be obvious, however, to one skilled in the art, that the present invention may be practiced without some or all of these specific details. In other instances, well known process operations have not been described in detail in order not to unnecessarily obscure the present invention.

One design technique to improve the Vtrip margin during the write operation is reducing the power supply voltage to the SRAM cells 110, but lowering the SRAM power supply voltage also reduces the SRAM SNM margin. Conversely, increasing the power supply voltage to the SRAM cells 110 improves the SNM margin, which is important for the read operation. Implementation of the claimed design technique uses two power supply voltages 125 and 130, selectively applied to the SRAM cells 110 during read and write operations. Switches are used to control which power supply is provided to selected SRAM cells 110.

Figure 1A:
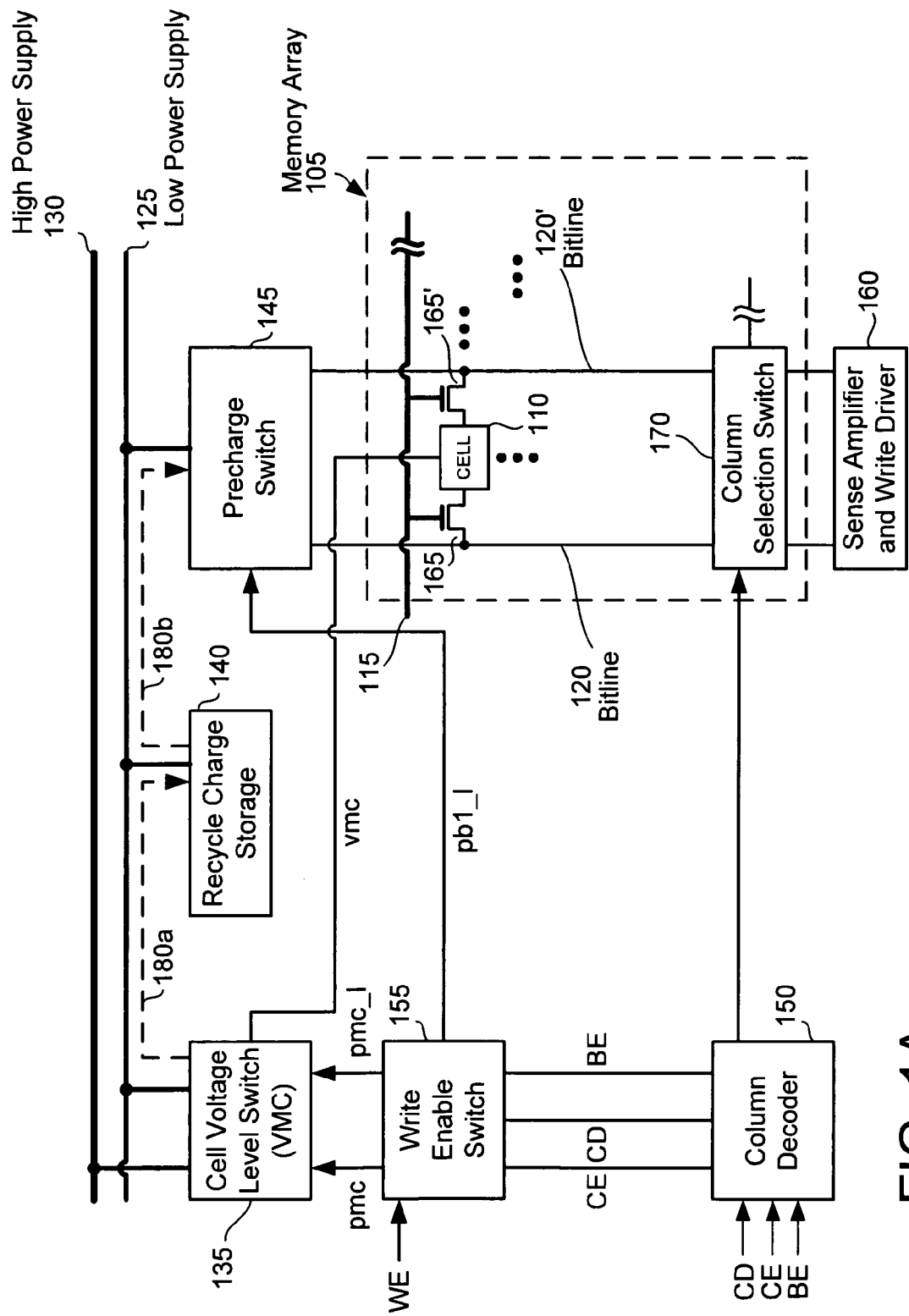
FIG. 1A illustrates a SRAM memory array implementing write and read assist circuitry with charge recycling in accordance with one embodiment of the present invention.

FIG. 1A illustrates a SRAM memory array 105 implementing write and read assist circuitry with charge recycling in accordance with one embodiment of the present invention. Generally speaking, the SRAM circuit controls the reading and writing of digital data into the memory array 105 assisted by recycling stored charge from the reading and writing operations.

The SRAM memory array 105 is composed of SRAM cells 110 arrayed in a grid of rows and columns. The SRAM memory array 105 can be subdivided into several memory blocks. Any or all of the blocks of SRAM cells 110 may be selected using a block enable input. For the purpose of clarity, only one of SRAM cells 110 of the memory array 105 is illustrated. Rows of SRAM cells 110 are accessed using a wordline 115 that couples to the passgates 165 and 165', which connect SRAM cells 110 to selected columns of SRAM cells 110, through bitlines 120 and 120'.

The SRAM write and read assist circuit with charge recycling uses two distinct power supplies, a low power supply 125 and a high power supply 130. The low power supply 125 provides a low power supply voltage to the bitlines 120 and 120' for precharging the bitlines 120 and 120' before the read operation, as well as selected SRAM cells 110 during the write operation. The high power supply 130 provides the power supply to the SRAM cells 110 during the read operation. In addition, the high power supply 130 is provided to the SRAM cells 110 in columns not identified for the write operation.

A cell voltage level switch 135 is connected to power supplies 125 and 130. The cell voltage level switch 135 has two distinct operating states, a write operation state and a read operation state. During the read operation state, the cell voltage level switch 135 provides the high power supply 130 to SRAM cells 110 in selected row(s) (e.g. by an active wordline 115), and for columns not identified for the read operation to occur.

During the write operation state, the cell voltage level switch 135 selectively provides the low power supply 125 to SRAM cells 110 in selected row(s) (e.g. by an active wordline 115), and for columns selected by the column decoder 150. In addition, the SRAM cells 110 in columns that are not identified for the write operation are provided the high power supply 130 during the write operation state.

A recycle charge storage 140 is coupled to the low power supply 125 and coupled to the high voltage supply 130 through the cell voltage level switch 135. The recycle charge storage 140 is also coupled to the bitlines 120 and 120' through a precharge switch 145. The recycle charge storage 140 has two distinct modes of operation: storing mode 180a and discharging mode 180b. In the storage mode 180a, the recycle charge storage 140 receives charge from the cell voltage level switch 135 of unselected columns after a write operation or from all the columns after a read operation state. In the discharging mode 180b, charge stored in the recycle charge storage 140 from the storage mode 180a is discharged to the precharge switch 145. The excess charge being used to complete a precharge operation by the precharge switch 145.

The precharge switch 145 is coupled to the low power supply 125 and to the bitlines 120 and 120' of the memory array 105. In addition, the precharge switch 145 is coupled to the cell voltage level switch 135 through the recycle charge storage 140. The precharge switch 145 provides current from the low voltage supply 125, in addition to current from the recycle charge storage 140, to the bitlines 120 and 120' before the next read or write operation state of the selected column (s).

A column decoder 150 identifies columns selected for the read or write operation state. The column decoder 150 transmits a signal to the column selection switch 170 to couple the bitlines 120 and 120' to the sense amplifier or write driver 160.

The write enable switch 155 is connected to the cell voltage level switch 135, the precharge switch 140, and the column decoder 150. The write enable switch 155 generates output signals pmc and pmc_1, which direct the cell voltage level switch 135 to provide the low power supply 125 and/or high power supply 130 to the SRAM cells 110 based on the write or read operation state of the selected column(s). The input signals to the cell voltage level switch 135 also enable the cell voltage level switch 135 to pass excess charge to the recycle charge storage 140 after the read and write operation states. The write enable switch 155 also provides input pb1_1 to the precharge switch 145, enabling precharging of the bitlines 120 and 120' during the read operation state for a selected column.

The column selection switch 170 is connected to the column decoder 150, the sense amplifier and write driver 160 and the bitlines 120 and 120'. The column selection switch 170 receives the y0 output from the column decoder 150. When the column decoder 150 selects a column, the column selection switch 170 couples either the sense amplifier or write driver 160 to the bitlines 120 and 120', depending on if the write operation state or read operation state has been identified.

Figures 1, 1B:
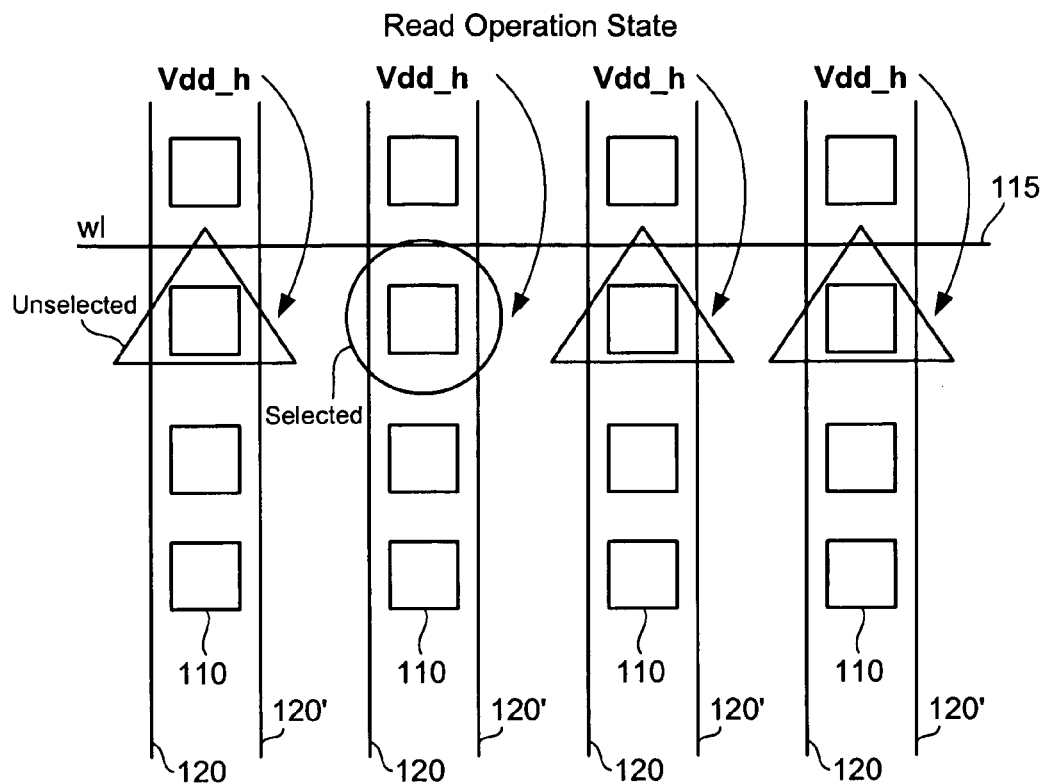
FIG. 1B-1 illustrates the read operation state bias condition of SRAM cells in a row selected by an active wordline in accordance with one embodiment of the present invention.

FIG. 1B-1 illustrates the read operation state bias condition of SRAM cells 110 in a row selected by an active wordline 115 in accordance with one embodiment of the present invention. For this simple example, selected cells are identified by an oval and unselected cells are noted by a triangle. During the read operation state, the SRAM cells 110 of the selected row are provided the high power supply 130 (Vdd_h), regardless whether the column is selected or unselected.

Figures 1, 1B, 2:
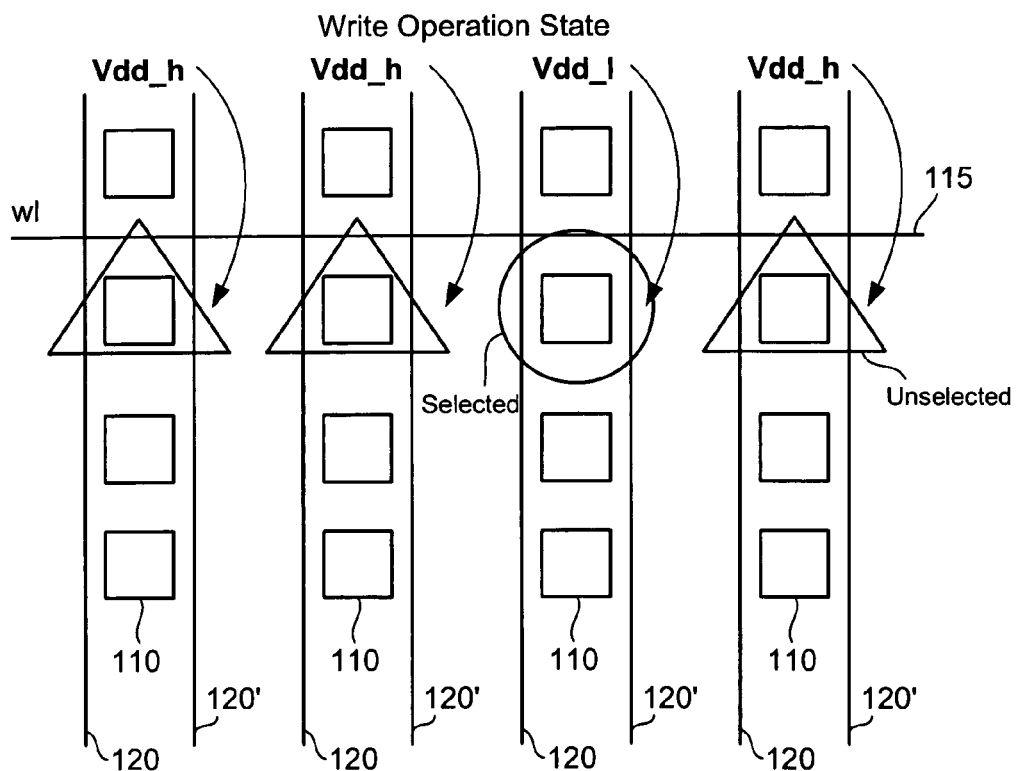

FIG. 1B-2 illustrates the write operation state bias condition of SRAM cells 110 in a row selected by an active wordline 115 in accordance with one embodiment of the present invention. During the write operation state, the SRAM cells 110 of the selected row are provided the low power supply 125 (Vdd$_{-1}$), if the SRAM cells 110 are in a column selected for the write operation state by the column decoder 150. If the SRAM cells 110 are not in columns identified for the write operation state, these SRAM cells 110 are provided the high power supply 130 (Vdd_h).

FIG. 2 illustrates embodiments of the logic circuitry for the cell voltage level switch 135, the precharge switch 145, and the column selection switch 170 in accordance with one embodiment of the present invention. The following description of the figure illustrates a specific embodiment of logic gates, switches and transistors. It should be noted other circuitry, logic gates, transistors, etc may be used to implement these circuit elements, so long as the logic functionality and the essential function of providing the low power supply 125 and the high power supply 130 to the SRAM cells 110 at the proper time is maintained.

In one embodiment of the cell voltage level switch 135 in accordance with one embodiment of the present invention, the cell voltage level switch 135 is formed using two PMOS transistors, 212 and 214, with the one output terminal from each transistor, 212 and 214, coupled to node VMC. The remaining output terminal of transistor 212 is coupled to the low power supply 125 and the remaining output terminal of transistor 214 is coupled to the high power supply 130. The input terminal of transistor 212 is coupled to the pmc output from the write enable switch 155 and the input terminal of transistor 214 is coupled to the pmc_1 output from the write enable switch 155.

When the output signal pmc from the write enable switch 155 is low, the low power supply 125 is provided to node VMC. The output signal pmc_1 from the write enable switch 155 is high when the output signal pmc is low, which turns off transistor 214. The result is the low power supply voltage 125 is provided to SRAM cells 110 in active memory blocks with column(s) selected for the write operation state.

Conversely, when the output pmc_1 from the write enable switch 155 is low, the high power supply 130 is provided to the SRAM cells 110 through transistor 212. This occurs whenever both the WE input and the y0 output from the column decoder 150 are both not high. In other words, the high power supply 130 is provided to the SRAM cells 110 during the read operation or when a column is not selected for the write operation by the column decoder 150.

In one embodiment of the precharge switch 145 in accordance with one embodiment of the present invention, the precharge switch 145 is implemented using two PMOS transistors 216 and 218. One output terminal of transistor 216 is coupled to the bitline 120 and one output terminal of transistor 218 is coupled to the bitline 120'. The remaining output terminal for transistors 216 and 218 are coupled to the low power supply 125. The input terminal for transistors 216 and 218 are coupled to the pb1_1 output from the write enable switch 155.

When the output pb1_1 from the write enable switch 155 is low, the low power supply 125 is provided to bitlines 120 and 120'. Based on the inputs CE and BE from the column decoder 150 and the logic of the write enable switch 155, the result is the low power supply 125 is provided to bitlines 120' and 120' for precharging except during the read or write operation state.

In one embodiment of the recycle charge storage 140, which is the capacitance of the node of the low power supply 125, in accordance with one embodiment of the present invention, which stores excess charge from the SRAM cells 110 in storage mode 180a and discharges stored excess charge in discharge mode 180b, is a capacitor. Optionally, any circuit element capable of storing charge may be used.

In one embodiment of the column selection switch 170 in accordance with one embodiment of the present invention, the column selection switch 170 is implemented using two transmission gates 220 and 224. One output terminal of transmission gate 220 is connected to bitline 120 and the remaining output terminal of the transmission gate 220 is coupled to the sense amplifier or write driver 160. One output terminal of transmission gate 224 is connected to bitline 120' and the remaining output terminal of the transmission gate 224 is coupled to the sense amplifier or write driver 160. The NMOS input for transmission gates 220 and 224 is coupled to the y0 output of the column decoder 150. The PMOS input for transmission gates 220 and 224 is coupled to the output of inverter 222. The input of inverter 222 is connected to y0 output of the column decoder 150.

When the y0 input to transmission gates 220 and 224 are high, the NMOS transistors in transmission gates 220 and 224 turn on. The y0 output to the inverter 222 goes high, which leads to low on the output of the inverter 222. When the output of the inverter 224 is low, the PMOS transistors in transmission gates 220 and 224 turn on. As a result, bitlines 120 and 120' are coupled to the sense amplifier and write driver 160 when the column is selected.

Figure 2:
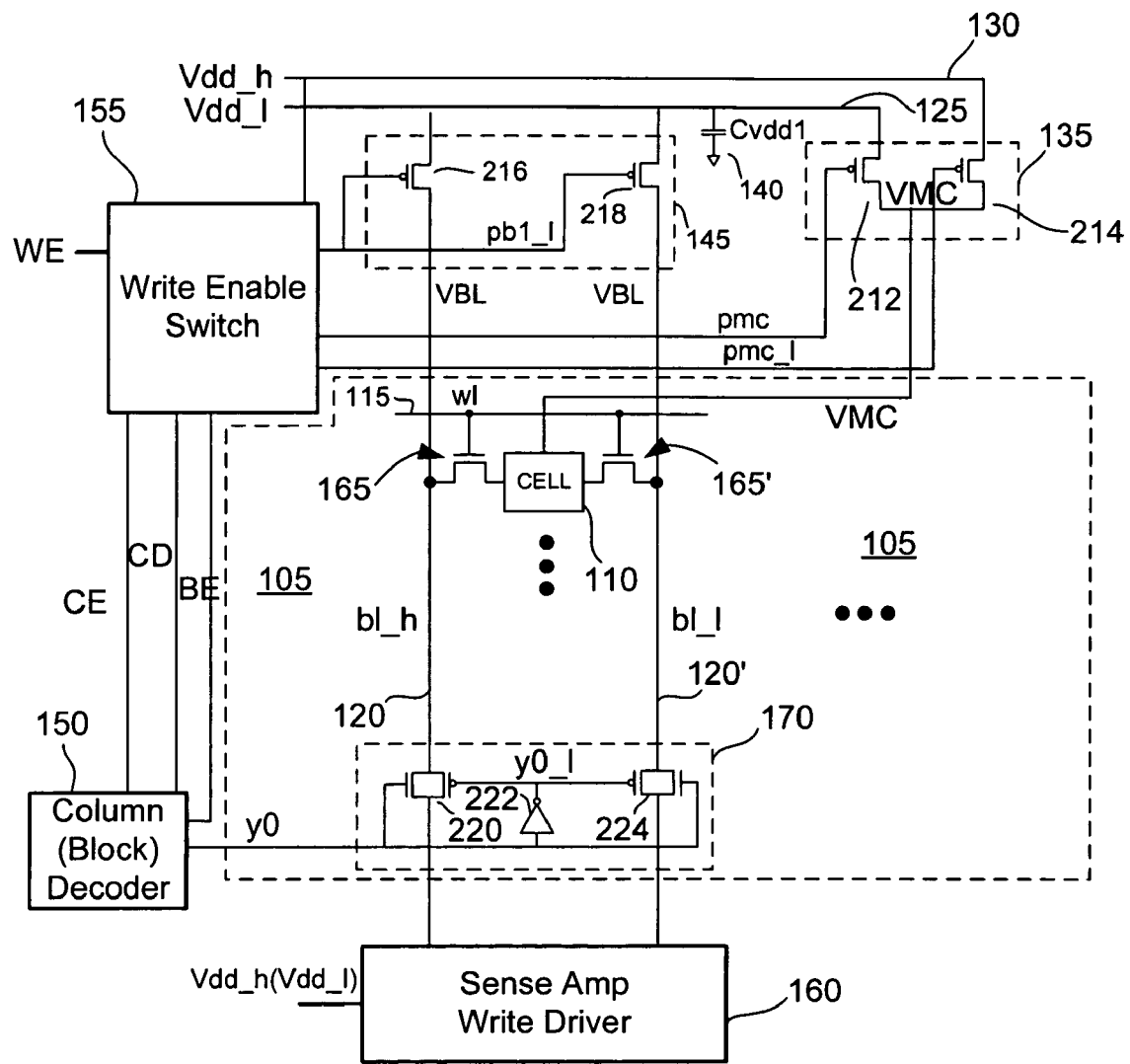
Figure 2A:
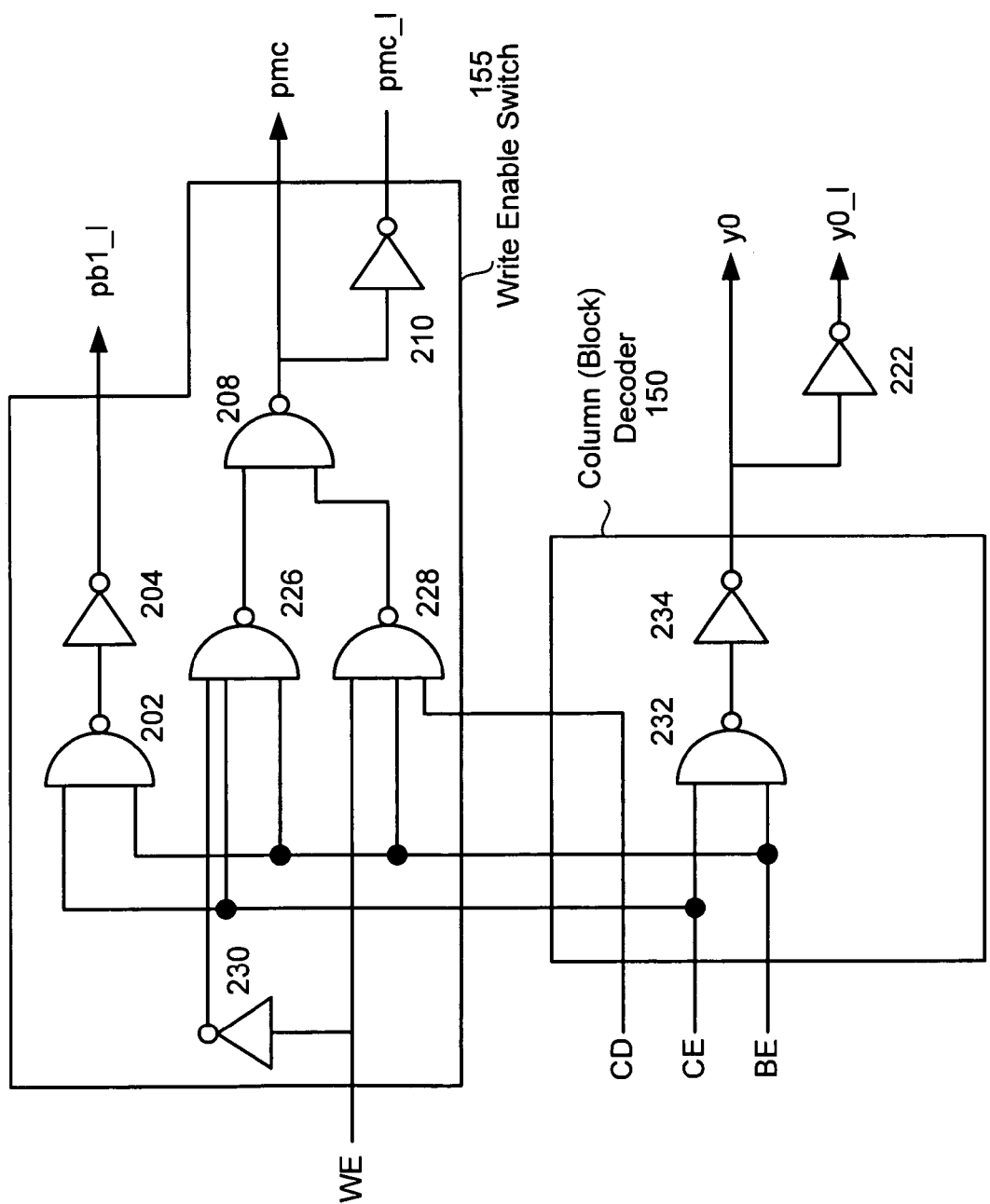
FIG. 2A illustrates embodiments of the logic circuitry for the write enable switch, and the column decoder in accordance with one embodiment of the present invention.

FIG. 2A illustrates embodiments of the logic circuitry for the write enable switch 155 and the column decoder 150 in accordance with one embodiment of the present invention. In one embodiment of the write enable switch 155 in accordance with one embodiment of the present invention, the logic generating the output signal pb1_1, to the precharge switch 145, is a two-input NAND gate 202 coupled to an inverter 204. One input to the NAND gate 202 is the CE input and the other input to the NAND gate 202 is the BE input. When both the CE and the BE inputs to the NAND gate 208 are high, the output from the NAND gate 202 is low. For all other combinations of input values of CE and BE, the output from the NAND gate 202 is high. The resulting pb1_1 is the inverted output from the NAND gate 202. In other words, pb1_1 is high except when a column is selected in an active memory block.

The logic used by the write enable switch 155 to generate the output signals, pmc and pmc_1, is implemented in two stages. The first stage of the logic implementation is two three-input NAND gates 226 and 228. The inputs to the first NAND gate 226 are the BE, CE and the output of an inverter 230 coupled to the WE input. When the BE and CE inputs are high and the WE input is low, the output of NAND gate 226 is low. For all other combinations of the BE, CE and WE input, the output of the NAND gate 226 is high. In other words, the output of NAND 226 is high, except when the column within an active memory block is selected for the read operation state.

The second NAND gate 228 receives the WE, CD, and BE inputs. When the WE, CD, and BE inputs are high, the output of NAND gate 228 is low. For all other combinations of the WE, CD, and BE inputs, the output of the NAND gate 228 is high. In other words, the output of NAND 228 is high, except when the memory block is active, but the column is not selected for the write operation.

The second stage of the write enable switch logic is a NAND gate 208 coupled to the input of an inverter 210. One input to the NAND gate 208 is the output of NAND gate 226 and the other input to the NAND gate 208 is coupled to the output of NAND gate 228. When both the outputs from NAND gates 226 and 228 are high, the output from the NAND gate 208, pmc, is low. For all other combinations of output from NAND gates 226 and 228, the output from the NAND gate 208, pmc, is high. The output from the NAND gate 208, pmc, is coupled to the inverter 210 to generate the output signal pmc_1. Conversely, output signal pmc_1 is high only when outputs of the NAND gate 226 and 228 are high.

In one embodiment of the column decoder 150 in accordance with one embodiment of the present invention, the column decoder 150 is implemented using a two input NAND gate 232 coupled to an inverter 234. The output of the NAND gate 232 is low only when both the CE and BE inputs are high. For all other input combinations, the output of the NAND gate 232 is high. The y0 output from the column decoder is the output from the NAND gate 232 after it has been inverted by inverter 234. The y0 output is high when the column is selected in the active memory block.

Figure 3:
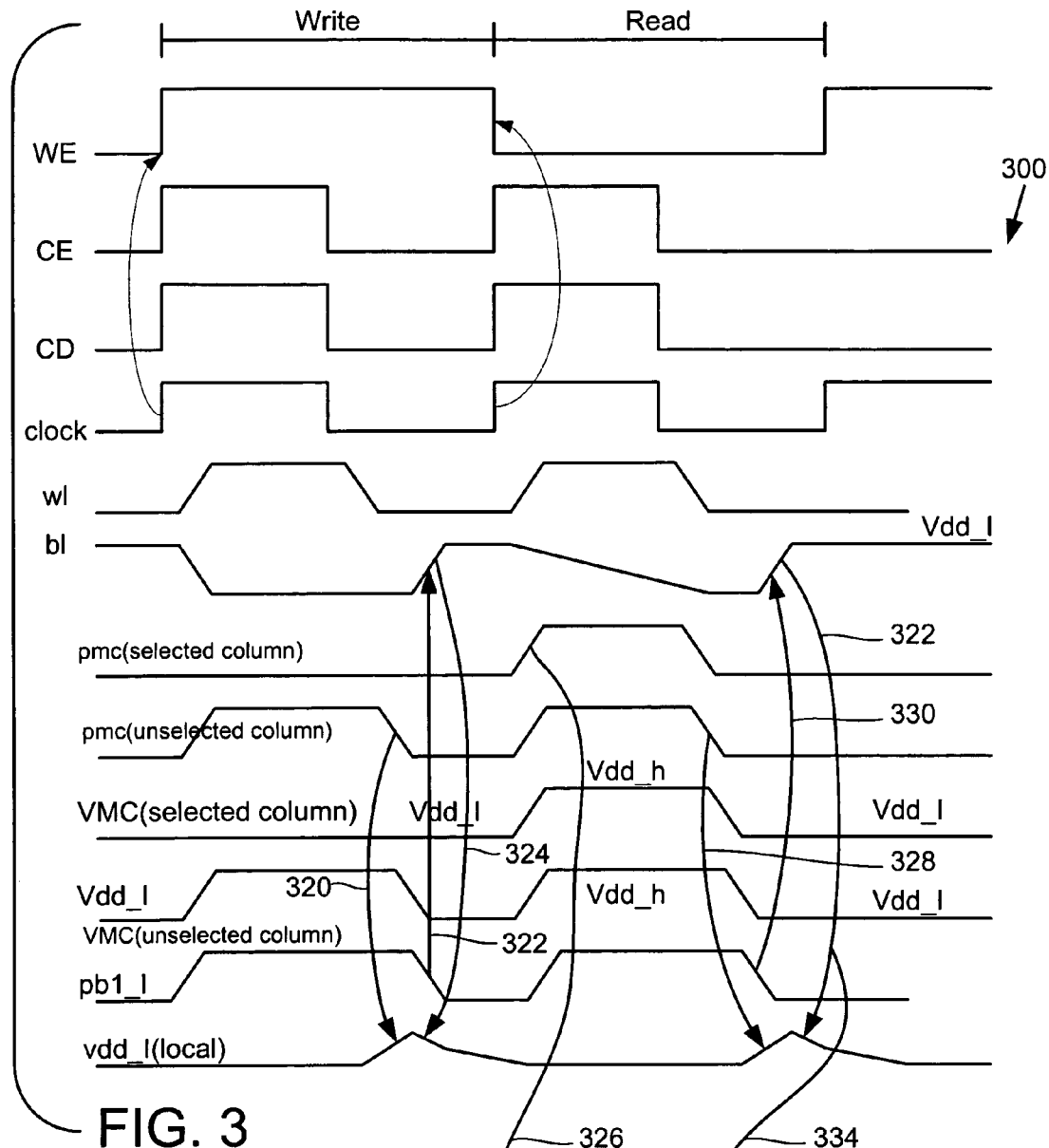
FIG. 3 illustrates the timing operation of the SRAM write and read assist circuit with charge recycling for an active memory block in accordance with one embodiment of the present invention.

FIG. 3 illustrates the timing diagram of the SRAM write and read assist circuit with charge recycling 300 for an active memory block in accordance with one embodiment of the present invention. For the purpose of clarity, the BE input is not shown and in this embodiment the BE input is high. During the write cycle 300, the WE input is high and the CE input is high for columns identified for the write operation state. The pmc output from the write enable switch 155 is low for columns identified for the write operation state. While the pmc output is low, transistor 212 in the cell voltage level switch 135 is turned on. Conversely, when the pmc_1 output from the write enable switch 155 is high, transistor 214 is turned off. When the pmc output is low, the cell voltage level switch 135 provides the low power supply 130 to the SRAM cells 110 of the columns selected for the write operation state. Also during this time, the wordline 115, turning on the passgates 165 and 165' coupling the SRAM cells 110 in the selected rows to the bitlines 120 and 120'. For the columns selected for the write operation state, the y0 output from the column decoder 150 is high, turning on the transmission gates 220 and 224, coupling the write driver 160 to the bitlines 120 and 120'. Digital data from the write driver 160 is written to the accessed SRAM cells 110.

For columns not selected for the write operation state, the CD input is high. This combination of input results in the pmc output going high and the pmc_1 output going low. While the pmc_1 output is low, transistor 214 in the cell voltage level switch 135 is turned on and transistor 212 is turned off. With transistor 214 turned on and transistor 212 turned off, the cell voltage level switch 135 provides the high power supply 125 to the SRAM cells 110 of the columns not selected for the write operation. Also during this time, the wordline 115 is high, turning on the passgates 165 and 165' coupling the SRAM cells 110 in the selected rows to the bitlines 120 and 120'.

As the pmc output transitions from high to low 320 in columns not identified for the write operation state, transistor 214 in the cell voltage level switch 135 turns off and transistor 212 turns on. The voltage at node VMC transitions from the high power supply 130 to the low power supply 125. While pmc transitions from high to low and pmc_1 transitions from low to high, node VMC is then coupled to the recycle charge storage 140 through the cell voltage level switch 135. The voltage difference between VMC and the recycle charge storage 140 triggers the storing mode 180a of the recycle charge storage 140, in which the SRAM cells 110 transfer excess charge from the SRAM cells 110 to the recycled charge storage 140 through the cell level voltage switch 135. The transfer of excess charge to the recycled charge storage 140 increases the voltage 320 of the recycled charge storage 140.

As the write operation state is completed, the pb1_1 output from the write enable switch 155 transitions from high to low 322. As the pb1_1 output goes low, transistors 216 and 218 turn on, coupling the bitlines 120 and 120' to the low power supply 125. Coupling the bitlines 120 and 120' to the recycled charge storage 140 through the precharge switch 145 triggers the discharge mode 180b of the recycle charge storage 140. The voltage of the recycled charge storage 140 drops 324 and the voltage on the bitlines 120 and 120' increases 322 to the low power supply 125. The voltage decrease at the recycle charge storage 140 is caused by charge sharing between the recycle charge storage 140 and the bitlines 120 and 120'.

During the read cycle 300 in columns identified for the read operation state, the WE input is low and the CE input is high. With these inputs, the pmc output from the write enable switch 155 is high, turning off transistor 212 in the cell voltage level switch 135. Conversely, the pmc_1 output from the write enable switch 155 is low, turning on transistor 214. When transistor 212 is turned off and transistor 214 is turned on, the cell voltage level switch 135 provides the high power supply 130 to the SRAM cells 110 of the selected columns. During this time, the wordline 115 is high, turning on the passgates 165 and 165' coupling the SRAM cells 110 in the selected rows to the bitlines 120 and 120'. The y0 output from the column decoder 150 to the column selector switch 170 is high, turning on the transmission gates 220 and 224, coupling the sense amplifier 160 to the bitlines 120 and 120'. Digital data from selected SRAM cells 110 can be read by the sense amplifier 160 coupled to the bitlines 120 and 120'.

For all columns after the read operation, the pmc output transitions from high to low 328, turning off transistor 214 and turning on transistor 212 in the cell voltage level switch 135. The voltage at the SRAM cells 110 transitions from the high power supply 130 to the low power supply 125. While pmc transitions from high to low and pmc_1 transitions from low to high, node VMC is coupled to the recycle charge storage 140 through the cell voltage level switch 135. The voltage difference between the SRAM cells 110 and the recycle charge storage 140 triggers the storing mode 180a of the recycle charge storage 140, in which the SRAM cells 110 to transfer excess charge from the SRAM cells 110 to the recycled charge storage 140 through the cell level voltage switch 135. The transfer of excess charge to the recycled charge storage 140 increases the voltage 320 of the recycled charge storage 140.

As the read operation state is completed, the pb1_1 output from the write enable switch 155 transitions from high to low 322. As the pb1_1 output goes low, transistors 216 and 218 turn on, coupling the bitlines 120 and 120' to the low power supply 125. Coupling the bitlines 120 and 120' to the recycled charge storage 140 through the precharge switch 145 triggers the discharge mode 180b of the recycle charge storage 140. The voltage of the recycled charge storage 140 drops 324 and the voltage on the bitlines 120 and 120' increases 322 to the low power supply 125. The decrease of the recycle charge storage 140 voltage is caused by charge sharing between the recycle charge storage 140 and the bitlines 120 and 120'.

Figure 4:
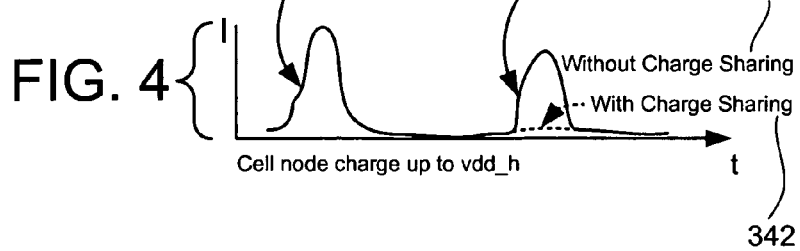
FIG. 4 illustrates the amount of current drawn from power supplies during operation of the write and read assist circuit as a function of time in accordance with one embodiment of the present invention.

FIG. 4 illustrates the amount of current drawn from power supplies 125 and 130 during operation of the write and read assist circuit as a function of time in accordance with one embodiment of the present invention. Increases in current flow from the power supplies 125 and 130 occur for two reasons. The first surge in current flow from the power supplies 125 and 130 occurs during charging of the SRAM cells 110 in columns identified for the read operation 326 from the low power supply 125 to the high power supply 130. As the pmc output from the write enable switch 155 goes high, the pmc_1 output goes low. The SRAM cells 110 in selected columns transitions from low power supply 125 to the high power supply 130 through the cell voltage level switch 135. The current 326 used to raise the voltage of the SRAM cells 110 from the low power supply 125 to the high power supply 130 is provided by the high power supply 130.

The second increase in current from the power supplies 125 and 130 occurs during precharging 334 of the bitlines 120 and 120'. In columns selected for the write operation state, current to precharge the bitlines 120 and 120' is solely provided by the low power supply 125, as shown by curve 340. In columns not identified for a write operation state, the discharge mode 180b of the recycled charge storage 140 provides charge in conjunction with current 342 from the low power supply 125 to precharge the bitlines 120 and 120'. Comparison of the charge from curve 340 versus curve 342 illustrates the reduction of current provided by the low power supply 125 when the recycled charge storage 140 assists completion of the precharge operation.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory circuit, comprising:
    (a) a memory array defined by SRAM cells, the memory array having rows and columns, and wordlines for accessing selected rows through a passgate and bitlines for accessing selected columns;
    (b) a cell voltage level switch connected to a low power supply and a high power supply, the cell voltage level switch having,
        (i) a write operation state defined to selectively provide the low power supply to SRAM cells in columns in which a write operation is to occur, and provide the high power supply to SRAM cells in columns in which the write operation is not identified to occur;
        (ii) a read operation state defined to selectively provide the high power supply to SRAM cells in columns in which a read operation is to occur, and provide the high power supply to SRAM cells in columns in which the read operation is not identified to occur;
    (c) a recycle charge storage;
    (d) a precharge switch connected to the low power supply and to the bitlines of the memory array, the precharge switch being coupled to the cell voltage level switch through the recycle charge storage;
    (e) a column decoder for identifying columns selected for the read or write operation state; and
    (f) a write enable switch connected to the cell voltage level switch, the precharge switch, and the column decoder.

2. A memory circuit of claim 1 wherein the cell voltage level switch is configured to provide the low and high power supplies to the SRAM cells based on the write or read operation state of the column, and the cell voltage level switch is configured to pass excess charge to the recycle charge storage after the read operation state or after the write operation state in columns in which the write operation state is not identified to occur, the excess charge being used to complete a precharge operation by the precharge switch.

3. A memory circuit of claim 2, further comprising:
    (g) a sense amplifier and write driver circuit coupled to each of the bitlines of the memory array.

4. A memory circuit of claim 3 wherein the sense amplifier defined to magnify a digital value stored in the SRAM cells exposed to the read operation state.

5. A memory circuit of claim 4 wherein the write driver defined to apply voltage levels to the bitlines of the memory array to define a digital value to store in the SRAM cells exposed to the write operation state.

6. A memory circuit of claim 5 wherein the recycle charge storage defined to store excess charge from SRAM cells when the voltage transitions from the high power supply to the low power supply.

7. A memory circuit of claim 6 wherein the recycle charge storage defined to store charge from SRAM cells when the voltage transitions from the high power supply to the low power supply due to the voltage difference between the recycle charge storage and the SRAM cells.

8. A memory circuit of claim 7 wherein the recycle charge storage defined to discharge excess charge to the bitlines through the precharge switch during bitline precharging, after the read or write operation state, due to the voltage difference between the recycle charge storage and the bitlines.

9. A method of setting power supply configuration during writing or reading digital data to SRAM memory cells using charge recycling, comprising the steps of:
    (a) selecting column(s) in which a read or write operation state is identified to occur, using output from the column decoder;
    (b) providing a power supply to SRAM cells through a cell voltage level switch,
        (i) the high power supply selectively to SRAM cells in columns in which a read operation state is to occur, and selectively provide the high power supply to SRAM cells in columns in which the read operation state is not identified to occur;
        (ii) the low power supply selectively to SRAM cells in columns in which a write operation state is to occur; and
        (iii) the high power supply selectively to SRAM cells in columns in which the write operation state is not identified to occur.

10. The method of claim 9 further comprising the step of:
    (c) accessing SRAM cells in which a read or write operation state is identified to occur, using a wordline to turn on a passgate,
        (i) writing digital data into the SRAM cells in which the write operation state is to occur; and
        (ii) reading digital data from SRAM cells in columns in which the read operation state is to occur.

11. The method of claim 10 further comprising the step of:
    (d) storing excess charge in a recycle charge storage when SRAM cells voltages transitions from the high power supply to the low power,
        (i) in columns in which the write operation state is not identified to occur;
        (ii) after the read operation state; and
    (e) precharging the bitlines after a read or write operation state.

12. The method of claim 11 wherein storing excess charge in a recycle charge storage through the cell voltage level switch when the SRAM cells voltage transitions from the high power supply to the low power due to the voltage difference between the SRAM cells and the recycle charge storage.

13. The method of claim 11 wherein precharging the bitlines after a read or write operation state discharges excess charge stored in the recycle charge storage due to the voltage difference between the bitlines and the recycle charge storage.

14. The method of claim 10 wherein writing data to SRAM cells using a write driver circuit applying voltage levels to the bitlines of the memory array to define a digital value to store in the SRAM cells exposed to the write operation state.

15. The method of claim 10 wherein reading data stored in the SRAM cells using a sense amplifier to magnify a digital value exposed to the read operation state.

16. A method of writing or reading digital data to SRAM memory cells using charge recycling, comprising the steps of:
(a) selecting column(s) in which a read or write operation is identified to occur, using output from the column decoder;
(b) providing a power supply to SRAM cells through a cell voltage level switch,
 (i) the high power supply selectively to SRAM cells in columns in which a read operation is to occur, and selectively provide the high power supply to SRAM cells in columns in which the read operation is not identified to occur;
 (ii) the low power supply selectively to SRAM cells in columns in which a write operation is to occur;
 (iii) the high power supply selectively to SRAM cells in columns in which the write operation is not identified to occur;
(c) accessing SRAM cells in which a read or write operation is identified to occur, using a wordline to turn on a passgate;
 (i) writing digital data into the SRAM cells in which the write operation is to occur;
 (ii) reading digital data from SRAM cells in columns in which the read operation is to occur;
(d) storing excess charge in a recycle charge storage when SRAM cells voltages transitions from the high power supply to the low power,
 (i) in columns in which the write operation is not identified to occur;
 (ii) after the read operation; and
(e) precharging the bitlines after a read or write operation.

17. The method of claim 16 wherein storing excess charge in a recycle charge storage through the cell voltage level switch when the SRAM cells voltage transitions from the high power supply to the low power due to the voltage difference between the SRAM cells and the recycle charge storage.

18. The method of claim 17 wherein precharging the bitlines after a read or write operation state discharges excess charge stored in the recycle charge storage due to the voltage difference between the bitlines and the recycle charge storage.

19. The method of claim 18 wherein writing data to SRAM cells using a write driver circuit applying voltage levels to the bitlines of the memory array to define a digital value to store in the SRAM cells exposed to the write operation state.

20. The method of claim 18 wherein reading data stored in the SRAM cells using a sense amplifier to magnify a digital value exposed to the read operation state.

* * * * *